United States Patent
Kim et al.

(10) Patent No.: US 8,427,883 B2
(45) Date of Patent: Apr. 23, 2013

(54) SETTING CIRCUIT AND INTEGRATED CIRCUIT INCLUDING THE SAME

(75) Inventors: Dae-Suk Kim, Gyeonggi-do (KR); Chang-Hyun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 194 days.

(21) Appl. No.: 12/980,788

(22) Filed: Dec. 29, 2010

(65) Prior Publication Data
US 2012/0008423 A1    Jan. 12, 2012

(30) Foreign Application Priority Data
Jul. 6, 2010    (KR) .................. 10-2010-0064853

(51) Int. Cl.
*G11C 7/10* (2006.01)
(52) U.S. Cl.
USPC . 365/189.05; 365/201; 365/154; 365/189.07; 365/189.08; 365/230.06

(58) Field of Classification Search ............. 365/189.05, 365/201, 154, 189.08, 230.01, 230.06
See application file for complete search history.

(56) References Cited

U.S. PATENT DOCUMENTS
2005/0102595 A1*   5/2005   Seo .............. 714/736

FOREIGN PATENT DOCUMENTS
KR            100337206           5/2002

OTHER PUBLICATIONS

Office Action issued by the Korean Intellectual Property Office on Jun. 28, 2012.

* cited by examiner

*Primary Examiner* — Thong Q Le
(74) *Attorney, Agent, or Firm* — IP & T Group LLP

(57) ABSTRACT

A setting circuit includes a selection unit configured to select one of a predefined code and an external code in response to a test signal, and a setting information generation unit configured to generate setting information in response to the code selected by the selection unit.

18 Claims, 3 Drawing Sheets

SETTING CIRCUIT AND INTEGRATED CIRCUIT INCLUDING THE SAME

CROSS-REFERENCE TO RELATED APPLICATION

The present application claims priority of Korean Patent Application No. 10-2010-0064853, filed on Jul. 6, 2010, which is incorporated herein by reference in its entirety.

BACKGROUND OF THE INVENTION

Exemplary embodiments of the present invention relate to a setting circuit and integrated circuit including the same.

A synchronous semiconductor memory device uses a mode register and a mode register set (MRS). The mode register is a device in which data for controlling various operation modes of the synchronous memory device is programmed and stored.

A central processing unit (CPU) accesses a synchronous semiconductor memory device in such a state that operation modes, such as a column address strobe latency (CL) or a column address strobe write latency (CWL), are previously set. Such a set operation mode is stored in mode registers, and a series of mode registers is referred to as a mode register set.

A series of codes representing the modes of the integrated circuit are set in the mode register set, and such codes are referred to an MRS code.

FIG. 1 is a diagram of a conventional setting circuit.

Referring to FIG. 1, the setting circuit includes a command decoding unit 110 and a setting information generation unit 120. The command decoding unit 110 is configured to activate a read signal RD, a write signal WT, and an MRS signal MRS in response to a command CMD and an address ADD. The setting information generation unit 120 is configured to generate setting information SET_INF in response to the address ADD when the MRS signal MRS is activated. The read signal RD is a signal applied when reading data from an integrated circuit, and the write signal WT is a signal applied when writing data to the integrated circuit.

The integrated circuit performs a test operation for testing operations under various environments, as well as general operations. In this case, in order to operate in other modes, the setting information generation unit 120 receives the address ADD and generates different setting information SET_IN.

An address input unit (not shown) receives the address ADD from the outside of the chip. Therefore, when the address ADD is received, a current flowing through the inside of the integrated circuit increases. In particular, in the case of a test operation which is frequently used, if the address ADD is received and the setting information SET_INF is generated in every test operation, a current flowing through the inside of the integrated circuit increases.

SUMMARY OF THE INVENTION

Exemplary embodiments of the present invention are directed to a setting circuit which generates setting information by using a predefined code during a test operation.

In accordance with an exemplary embodiment of the present invention, a setting circuit includes a selection unit configured to select one of a predefined code and an external code in response to a test signal, and a setting information generation unit configured to generate setting information in response to the code selected by the selection unit.

The setting circuit may further include a predefined code storage unit configured to store and output the predefined code.

The setting information generation unit may include a selection code storage circuit configured to store the code selected by the selection unit when a test MRS signal is activated at a point of time when the MRS signal or the test signal is activated, and a setting information generation circuit configured to generate the setting information in response to the code stored in the selection code storage circuit.

In accordance with another exemplary embodiment of the present invention, an integrated circuit includes an address input circuit configured to receive an address, a command input circuit configured to receive a command, a command decoding unit configured to decode the address and the command and generate a mode register set (MRS) signal, a selection unit configured to select the address or a predefined code in response to a test signal, and a setting information generation unit configured to generate setting information by using an output signal of the selection unit when the MRS signal is activated.

The integrated circuit may further include a predefined code storage unit configured to store the predefined code.

The setting information generation unit may include a selection code storage circuit configured to store the output signal of the selection unit when the MRS signal is activated at a point of time when the MRS signal or the test signal is activated, and a setting information generation circuit configured to generate the setting information by using the output signal of the selection unit which is stored in the selection code storage circuit.

In accordance with yet another exemplary embodiment of the present invention, a setting method includes selecting one of a predefined code and an external code in response to a test signal, and generating setting information in response to the selected code.

DESCRIPTION OF SPECIFIC EMBODIMENTS

Figure 1:
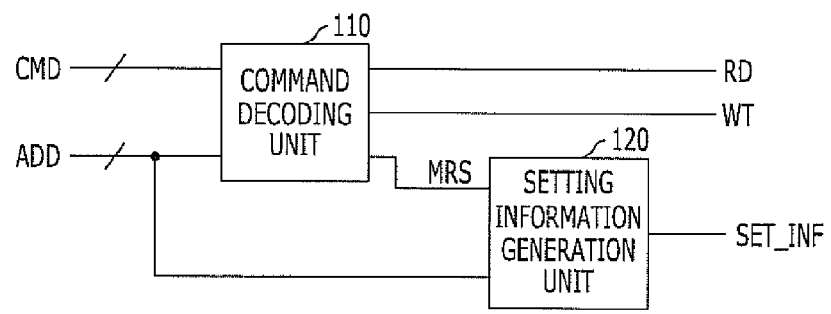
FIG. 1 is a diagram of a conventional setting circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
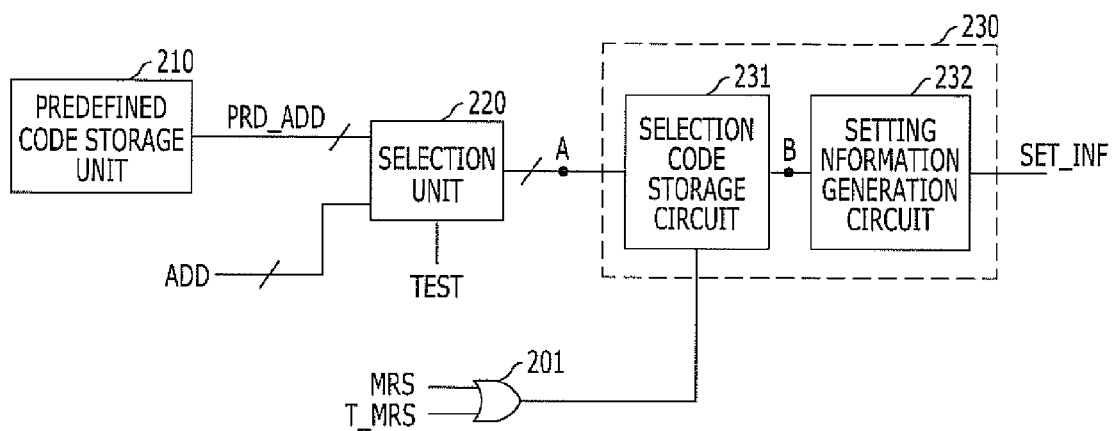
FIG. 2 is a diagram of a setting circuit in accordance with an exemplary embodiment of the present invention.

FIG. 2 is a diagram of a setting circuit in accordance with an exemplary embodiment of the present invention.

Referring to FIG. 2, the setting circuit includes a predefined code storage unit 210, a selection unit 220, and a setting information generation unit 230. The predefined code storage unit 210 is configured to store and output a predefined code PRD_ADD. The selection unit 220 is configured to select either the predefined code PRD_ADD or an external code ADD in response to a test signal TEST. The setting information generation unit 230 is configured to generate setting information SET_INF in response to the code selected by the selection unit 220.

The predefined code storage unit 210 may be implemented with a latch circuit which stores an address predefined for a test operation.

Figure 5:
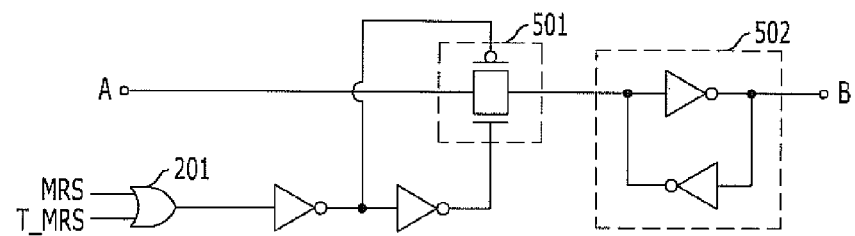
FIG. 5 is a diagram of a part of a selection code storage circuit in accordance with an exemplary embodiment of the present invention.

The setting information generation unit 230 includes a selection code storage circuit 231 and a setting information generation circuit 232. The selection code storage circuit 231 is configured to store the code selected by the selection unit 220 when a test MRS signal T_MRS is activated at a point of time when an MRS signal MRS or the test signal TEST is activated. The setting information generation circuit 232 is configured to generate the setting information SET_INF in response to the code stored in the selection code storage circuit 231. An exemplary configuration of the selection code storage circuit 231 is illustrated in FIG. 5.

The external code ADD is an address inputted from the outside. Also, in the following description, the setting information SET_INF is the MRS code which has been described in the background of the invention. The operation of the setting circuit will be described below with reference to FIG. 4.

Figure 3:
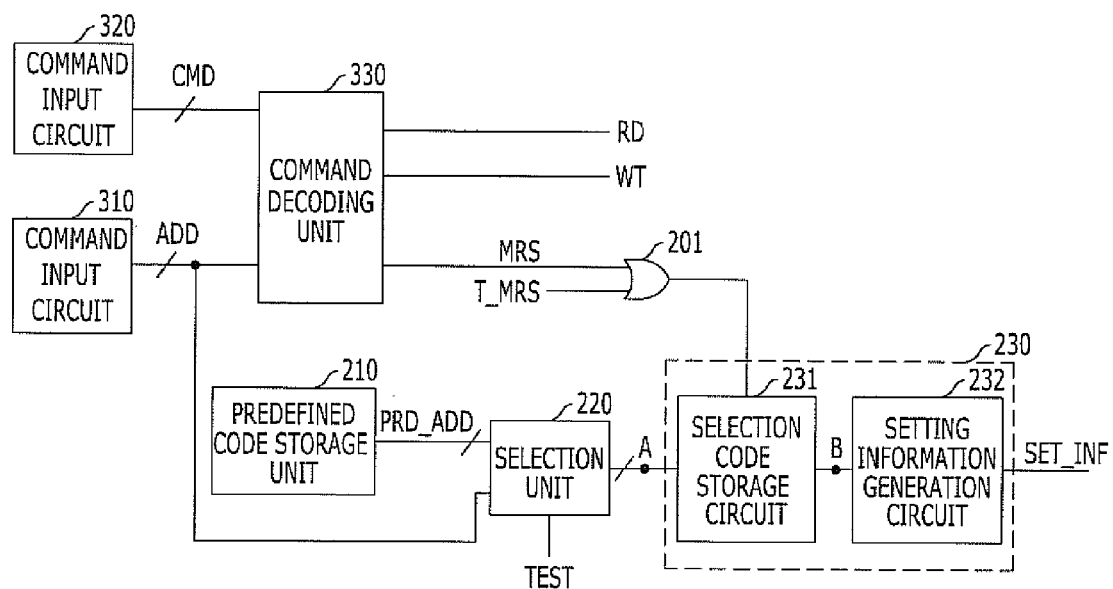
FIG. 3 is a diagram of an integrated circuit in accordance with an exemplary embodiment of the present invention.

FIG. 3 is a diagram of an integrated circuit in accordance with an exemplary embodiment of the present invention.

Referring to FIG. 3, the integrated circuit includes a predefined code storage unit 210, an address input circuit 310, a command input circuit 320, a command decoding unit 330, a selection unit 220, and a setting information generation unit 230. The predefined code storage unit 210 is configured to store a predefined code PRD_ADD. The address input circuit 310 is configured to receive an address ADD. The command input circuit 320 is configured to receive a command CMD. The command decoding unit 330 is configured to decode the address ADD and the command CMD and generate an MRS signal MRS. The selection unit 220 is configured to select the address ADD or the predefined code PRD_ADD in response to a test signal TEST. The setting information generation unit 230 is configured to generate setting information SET_INF by using the output signal of the selection unit 220 when the MRS signal MRS is activated.

The predefined code storage unit 210 may be implemented with a latch circuit which stores an address predefined for a test operation.

The setting information generation unit 230 includes a selection code storage circuit 231 and a setting information generation circuit 232. The selection code storage circuit 231 is configured to store the output signal of the selection unit 220 when a test MRS signal T_MRS is activated at a point of time when the MRS signal MRS or the test signal TEST is activated. The setting information generation circuit 232 is configured to generate the setting information SET_INF by using the output signal of the selection unit 220, which is stored in the selection code storage circuit 231. Hereinafter, the external code ADD of FIG. 2 is substantially identical to the address ADD of FIG. 3.

In the following description, the setting information SET_INF is the MRS code which has been described in the background of the invention.

The operation of the setting circuit of FIG. 2 and the integrated circuit of FIG. 3 is described below. Hereinafter, the state of the integrated circuit during the operation of generating the setting information SET_INF by using the predefined code PRD_ADD when the test signal TEST is activated is referred to as a test mode, and the state of the integrated circuit during the operation of generating the setting information by using the address ADD when the test signal TEST is deactivated is referred to as a normal mode. The description about the operation of generating the setting information SET_INF in the normal mode is followed by the description about the operation of generating the setting information in the test mode.

In the normal mode, the test signal TEST is deactivated and the selection unit 220 outputs the address ADD. The address ADD represents the address which is received from the outside by the address input circuit 310.

The command decoding unit 330 decodes the command CMD and the address ADD, and activates a read signal RD, a write signal WT, and an MRS signal MRS according to the inputted command CMD and address ADD.

When the command decoding unit 330 activates the MRS signal MRS in such a state that the test signal TEST is deactivated, the selection code storage circuit 231 stores and outputs the address ADD which is outputted from the selection unit 220. The setting information generation circuit 232 generates the corresponding setting information SET_INF by using the address ADD, which is stored and outputted by the selection code storage circuit 231. That is, in the normal mode, the setting information SET_INF is generated using the address ADD inputted from the outside. This method is substantially identical to the method of generating the setting information SET_INF in the conventional setting circuit of FIG. 1. The setting information generation circuit 232 corresponds to a general decoding circuit which generates the setting information SET_INF by decoding the output signal of the selection unit 220.

In the test mode, the test signal TEST is activated and the selection unit 220 outputs the predefined code PRD_ADD. The predefined code PRD_ADD represents a code in which the corresponding address is previously stored in order to generate the setting information SET_INF for the test mode.

When the test signal TEST is activated, the setting information generation unit 230 generates the setting information SET_INF by using the output signal of the selection unit 220, regardless of the activation of the MRS signal MRS. In this case, the test MRS signal T_MRS is activated at a point of time when the test signal TEST is activated. Thus, the selection code storage circuit 231 stores and outputs the predefined code PRD_ADD, which is outputted from the selection unit 220. The setting information generation circuit 232 generates the corresponding setting information SET_INF by using the predefined code PRD_ADD, which is stored and outputted by the selection code storage circuit 231. That is, in the test mode, the setting information SET_INF is generated using the predefined code PRD_ADD, instead of the address ADD inputted from the outside. Through this method, the setting information SET_INF can be generated in the test mode more conveniently than in the conventional setting circuit. Moreover, since the address ADD need not be inputted from the outside, a current flowing through the inside of the integrated circuit can be reduced.

Figure 4:
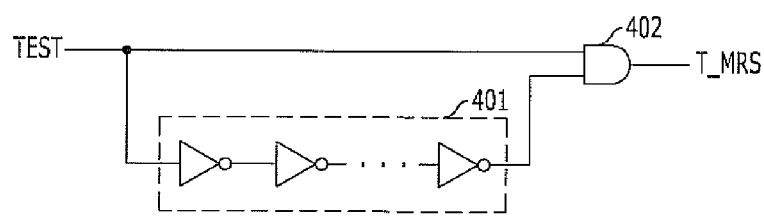
FIG. 4 is a diagram of a circuit for generating a test MRS signal by using a test signal.

In this case, the test MRS signal T_MRS may be a signal generated from a circuit of FIG. 4 in response to the test signal TEST, or may be a portion of the MRS signal MRS. If the test MRS signal T_MRS is generated from a portion of the MRS signal, then an OR gate 201 is unnecessary and the setting information generation unit 230 has only to receive the MRS signal MRS.

FIG. 4 is a diagram of a circuit for generating the test MRS signal T_MRS by using the test signal TEST.

Referring to FIG. 4, when the test signal TEST is activated, the test MRS signal T_MRS must cause the selection code storage circuit 231 to store the predefined code PRD_ADD selected by the selection unit 220. Therefore, the test signal TEST and a signal generated by passing the test signal TEST through an inverter chain 401 including an odd number of inverters are logically combined by an AND gate 402, and the combined signal is generated as the test MRS signal T_MRS. Therefore, when the test signal TEST is activated, the test MRS signal T_MRS is activated simultaneously. More specifically, in the test mode, the test MRS signal T_MRS becomes a pulse wave having an activation period that is equal to a delay time of the inverter chain 401. Any configuration may be used herein as long as it can generate the test MRS signal T_MRS to be a pulse wave.

FIG. 5 is a diagram of a part of the selection code storage circuit 231 in accordance with an exemplary embodiment of the present invention.

Referring to FIG. 5, the selection code storage circuit 231 includes a pass gate 501 and a latch unit 502. The pass gate 501 is configured to pass the output signal of the selection unit 220 only when the test MRS signal T_MRS or the MRS signal MRS is activated. The latch unit 502 is configured to store the output signal of the selection unit 220 which has passed through the pass gate 501. A first terminal A represents an input terminal of the selection code storage circuit 231, and a second terminal B represents an output terminal of the selection code storage circuit 231.

When the test MRS signal T_MRS is activated, the predefined code PRD_ADD is passed through the pass gate 501 and stored in the latch unit 502. When the test signal MRS is activated, the address ADD is passed through the pass gate 501 and stored in the latch unit 502. The selection code storage circuit 231 may have any configuration as long as it can perform the function described with reference to FIG. 5.

The setting information generation circuit 232 generates the setting information SET_INF in response to the output signal of the selection unit 220 which is stored in the latch unit 502. The setting information generation unit 230 may have the substantially same configuration as that of the setting information generation unit 120 of the conventional setting circuit illustrated in FIG. 1. However, the setting information generation unit 230 in accordance with an exemplary embodiment of the present invention generates the setting information SET_INF in response to the output signal of the selection unit 220, whereas the setting information generation unit 120 of the conventional setting circuit illustrated in FIG. 1 generates the setting information SET_INF in response to the address ADD inputted from the outside.

Furthermore, since the circuit of FIG. 5 can store a 1-bit code, the selection code storage circuit 231 must include N number of the circuits illustrated in FIG. 5 when the predefined code PRD_ADD or the address ADD is N bits, where N may be any positive integer.

Figure 6:
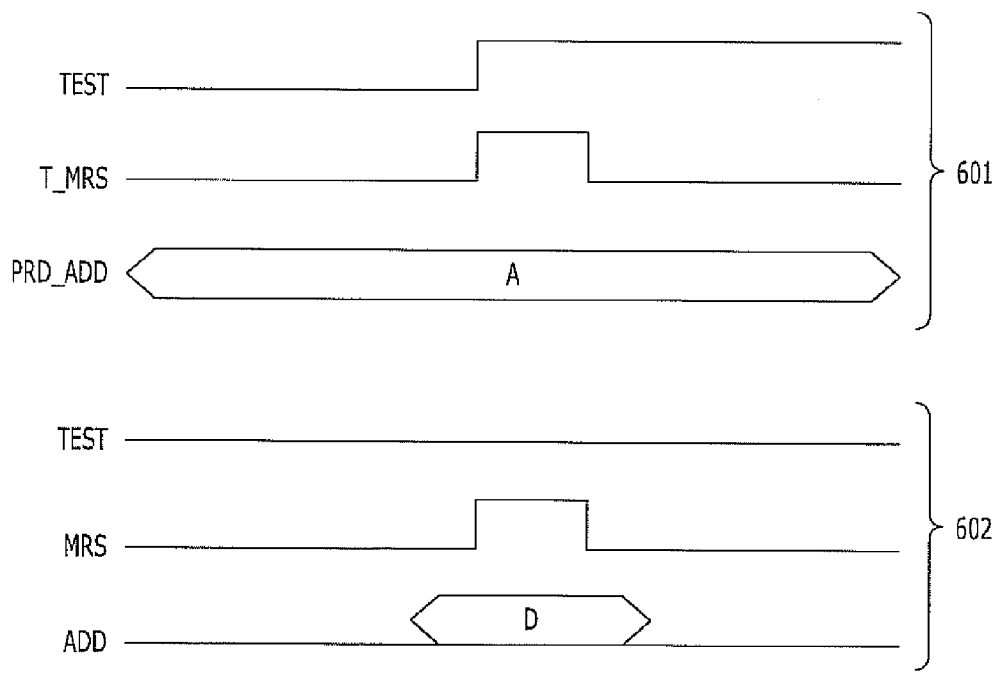
FIG. 6 is a waveform diagram illustrating the operation of the setting circuit in accordance with an exemplary embodiment of the present invention.

FIG. 6 is a waveform diagram illustrating the operation of the setting circuit in accordance with an exemplary embodiment of the present invention.

The first group of waveforms 601 explain the operation of the setting circuit in the test mode. When the test signal TEST is activated, the test MRS signal T_MRS is also activated. When the predefined code PRD_ADD stored in the predefined code storage unit 210 is selected and outputted by the selection unit 220, the output signal of the selection unit 220 is inputted and stored in the selection code storage circuit 231 during a period where the test MRS signal T_MRS is activated. The setting information generation circuit 232 generates the setting information SET_INF in response to the predefined code PRD_ADD which is previously stored in the selection code storage circuit 231.

The second group of waveforms 602 explain the operation of the setting circuit in the normal mode. When the test signal TEST is deactivated, the address ADD is selected and outputted by the selection unit 220. When the MRS signal MRS is activated by the command decoding unit 330, the output signal of the selection unit 220 is stored in the selection code storage circuit 231. The setting information generation circuit 232 generates the setting information SET_INF in response to the address ADD stored in the selection code storage circuit 231.

A setting method in accordance with an exemplary embodiment of the present invention is described below with reference to FIGS. 2 to 5.

The setting method in accordance with an exemplary embodiment of the present invention includes selecting one of the predefined code PRD_ADD and the external code ADD in response to a test signal TEST, and generating the setting information SET_INF in response to the selected code.

When the test signal TEST is activated, the predefined code PRD_ADD is selected. When the test signal TEST is deactivated, the external code ADD is selected.

The external code ADD is an address inputted from the outside.

The setting circuit in accordance with an exemplary embodiment of the present invention generates the setting information by using the predefined code during the test operation. Therefore, the setting information may be conveniently generated because the address is not received from the address input circuit during the test operation. Moreover, the current consumption may be reduced because an unnecessary current does not flow from the address input circuit to the setting circuit.

While the present invention has been described with respect to the specific embodiments, it will be apparent to those skilled in the art that various changes and modifications may be made without departing from the spirit and scope of the invention as defined in the following claims.

What is claimed is:

1. A setting circuit comprising:
   a selection unit configured to select one of a predefined code and an external code in response to a test signal; and
   a setting information generation unit configured to generate setting information in response to the code selected by the selection unit.

2. The setting circuit of claim 1, wherein the selection unit is configured to select the predefined code when the test signal is activated, and select the external code when the test signal is deactivated.

3. The setting circuit of claim 1, wherein the external code comprises an address inputted from the outside.

4. The setting circuit of claim 1, wherein the setting information comprises a mode register set (MRS) code.

5. The setting circuit of claim 1, further comprising a predefined code storage unit configured to store and output the predefined code.

6. The setting circuit of claim 1, wherein the setting information generation unit comprises:

a selection code storage circuit configured to store the code selected by the selection unit when a test MRS signal is activated at a point of time when the MRS signal or the test signal is activated; and a setting information generation circuit configured to generate the setting information in response to the code stored in the selection code storage circuit.

7. An integrated circuit, comprising:

an address input circuit configured to receive an address;

a command input circuit configured to receive a command;

a command decoding unit configured to decode the address and the command and generate a mode register set (MRS) signal;

a selection unit configured to select the address or a predefined code in response to a test signal; and a setting information generation unit configured to generate setting information by using an output signal of the selection unit when the MRS signal is activated.

8. The integrated circuit of claim 7, wherein the selection unit is configured to select the predefined code when the test signal is activated, and select the address when the test signal is deactivated.

9. The integrated circuit of claim 7, wherein the setting information comprises an MRS code.

10. The integrated circuit of claim 7, wherein the setting information generation unit is configured to generate the setting information by using the output signal of the selection unit when the test signal is activated, regardless of the activation of the MRS signal.

11. The integrated circuit of claim 7, further comprising a predefined code storage unit configured to store the predefined code.

12. The integrated circuit of claim 7, wherein the setting information generation unit comprises:

a selection code storage circuit configured to store the output signal of the selection unit when the MRS signal is activated at a point of time when the MRS signal or the test signal is activated; and a setting information generation circuit configured to generate the setting information by using the output signal of the selection unit which is stored in the selection code storage circuit.

13. A setting method comprising:

selecting one of a predefined code and an external code in response to a test signal; and generating setting information in response to the selected code.

14. The setting method of claim 13, wherein the predefined code is selected when the test signal is activated, and the external code is selected when the test signal is deactivated.

15. The setting method of claim 13, wherein the external code comprises an address inputted from the outside.

16. The setting method of claim 13, further comprising:

generating an MRS signal;

generating a test MRS signal; and storing the selected code when the test MRS signal is activated at a point of time when the MRS signal or the test signal is activated.

17. The setting method of claim 16, wherein the generating of the setting information comprises generating the setting information in response to the code stored in the selection code storage circuit.

18. The setting method of claim 17, wherein the test MRS signal is generated from the test signal and the test MRS signal is a pulse wave.

* * * * *